United States Patent
Janke et al.

(10) Patent No.: US 7,996,742 B2
(45) Date of Patent: Aug. 9, 2011

(54) CIRCUIT ARRANGEMENT AND METHOD FOR CHECKING THE FUNCTION OF A LOGIC CIRCUIT IN A CIRCUIT ARRANGEMENT

(75) Inventors: Marcus Janke, Munich (DE); Franz Klug, Munich (DE); Peter Laackmann, Munich (DE); Dirk Rabe, Emden (DE); Stefan Rueping, Lengdorf (DE)

(73) Assignee: Infineon Technologies AG, Neubiberg (DE)

( * ) Notice: Subject to any disclaimer, the term of this patent is extended or adjusted under 35 U.S.C. 154(b) by 268 days.

(21) Appl. No.: 12/268,226

(22) Filed: Nov. 10, 2008

(65) Prior Publication Data
US 2009/0172489 A1      Jul. 2, 2009

(30) Foreign Application Priority Data
Nov. 8, 2007   (DE) .......................... 10 2007 053 295

(51) Int. Cl.
*G06F 11/00*       (2006.01)
(52) U.S. Cl. ........................................ 714/735; 714/733
(58) Field of Classification Search ................... 726/23; 713/189, 164; 341/51; 714/735, 724, 733
See application file for complete search history.

(56) References Cited

U.S. PATENT DOCUMENTS

| | | | |
|---|---|---|---|
| 7,383,577 B2 * | 6/2008 | Hrastar et al. | 726/23 |
| 7,437,569 B2 * | 10/2008 | Le Quere | 713/189 |
| 7,457,951 B1 * | 11/2008 | Proudler et al. | 713/164 |
| 7,519,831 B2 * | 4/2009 | LeQuere | 713/189 |
| 7,653,855 B2 * | 1/2010 | Yasuda et al. | 714/739 |
| 2007/0188355 A1 * | 8/2007 | Baek | 341/51 |
| 2007/0226551 A1 | 9/2007 | Janke et al. | |
| 2007/0277070 A1 | 11/2007 | Janke et al. | |

FOREIGN PATENT DOCUMENTS

| | | |
|---|---|---|
| DE | 10 2006 001 872 A1 | 7/2007 |
| DE | 10 2006 001 873 A1 | 7/2007 |

* cited by examiner

*Primary Examiner* — David Ton
(74) *Attorney, Agent, or Firm* — Dickstein Shapiro LLP.

(57) ABSTRACT

A circuit arrangement comprising a logic circuit to be tested and a test circuit. The logic circuit comprising logic-circuit-internal combinations configured to generate output data from input data based on a predetermined relationship. The logic circuit is configured to detect whether the relationship is satisfied and to provide an error signal if the relationship is not satisfied. The test circuit is configured to alter logic-circuit-internal combinations, to detect the error signal, and to output an alarm signal if the error signal is not detected upon alteration of the logic-circuit-internal combinations.

19 Claims, 10 Drawing Sheets

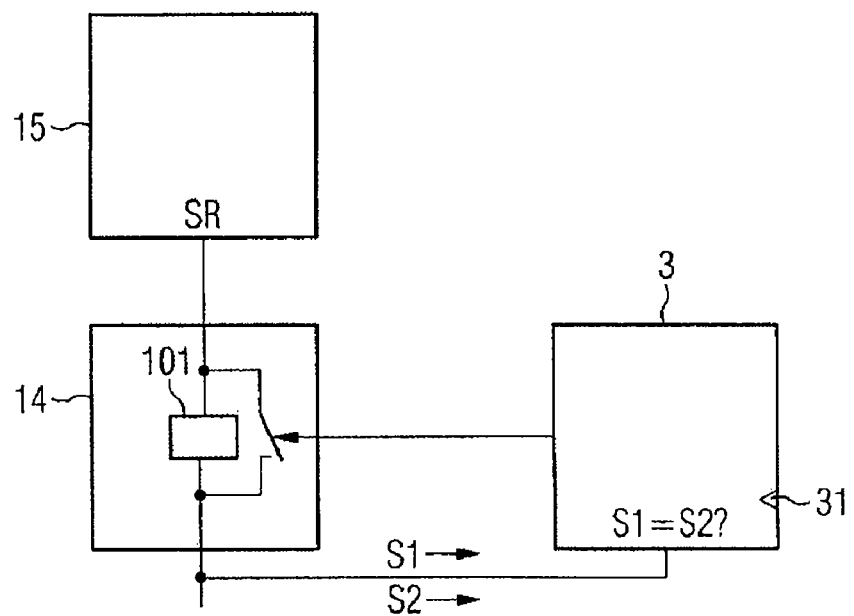
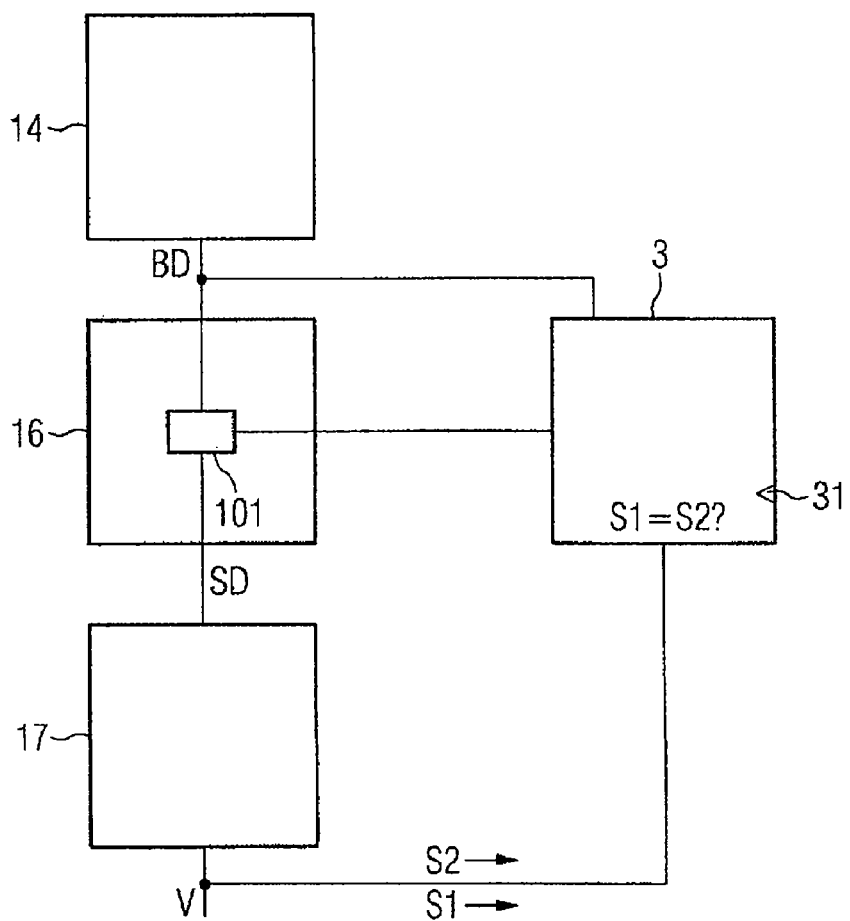

CIRCUIT ARRANGEMENT AND METHOD FOR CHECKING THE FUNCTION OF A LOGIC CIRCUIT IN A CIRCUIT ARRANGEMENT

The invention relates to a circuit arrangement and to a method for checking the function of a logic circuit in a circuit arrangement.

BACKGROUND OF THE INVENTION

Circuit arrangements such as are used in smart cards, for example, can be exposed to attacks. In order to avert such attacks, countermeasures are usually provided which are triggered after detection of an attack. Said countermeasures are intended at least to make it more difficult to spy out data or the functioning of the circuit arrangement.

In order to identify an attack it is possible to use analog sensors, for example, which detect an alteration of the operating conditions. Such sensors can be embodied as a voltage sensor, frequency sensor, temperature sensor or light sensor. If the measured value exceeds a predetermined threshold value, an alarm is triggered, as a consequence of which the countermeasures are initiated.

In order to check the functionality of the sensors, it is possible to use a so-called "Usermode Sensor Life Control", abbreviated to "UmSLC". During a test, the sensors are adjusted or stimulated by the UmSLC in such a way that an alarm is triggered. In test operation, however, normally no countermeasures are initiated in reaction to said alarm, rather a check is merely made to determine whether the alarm is generated after adjustment or stimulation of the sensor. If the alarm fails to occur, this allows the conclusion to be drawn of an attack in which the sensor has been manipulated or deactivated. This procedure serves as a functional test of circuit arrangements with analog sensors. The conventional UmSLC, oriented to testing analog sensors, cannot be used for logic circuits whose functionality is to be checked.

SUMMARY OF THE INVENTION

A circuit arrangement comprising a logic circuit to be tested and a test circuit is provided. The logic circuit is designed to provide output data from input data, said output data being generated from the input data by logic-circuit-internal combinations, such that the output data are in a predetermined relationship with the input data. The logic circuit is designed to detect whether the relationship is fulfilled and to provide an error signal if the relationship is not fulfilled. The test circuit is designed to alter states of the logic-circuit-internal combinations. The test circuit is furthermore designed to detect the error signal, and is designed to output an alarm signal if the error signal is not detected upon alteration of the logic-circuit-internal combinations.

DRAWINGS

FIG. 20 shows an exemplary embodiment with a memory encryption device.

FIG. 21 shows an exemplary embodiment with a decoder.

DETAILED DESCRIPTION OF THE INVENTION

Figure 1:
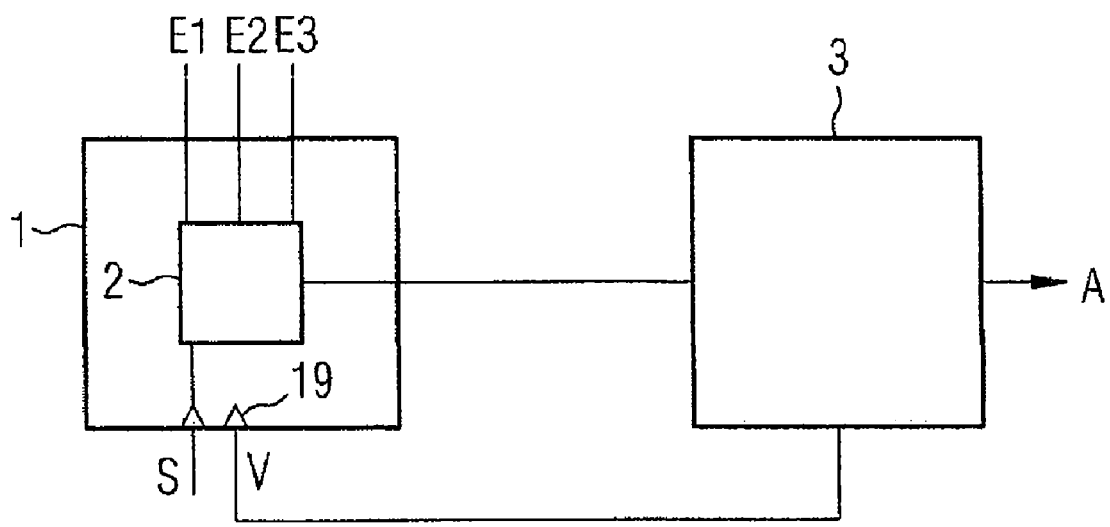
FIG. 1 shows an exemplary embodiment of a circuit arrangement.

The invention is described below on the basis of exemplary embodiments with reference to the drawing.

FIG. 1 shows an exemplary embodiment of the circuit arrangement. The circuit arrangement comprises a logic circuit 1 to be tested and a test circuit 3. A logic circuit 1 is designed to provide output data S from input data E1, E2, E3, said output data being generated from the input data E1, E2, E3 by logic-circuit-internal combinations 2, such that the output data S are in a predetermined relationship with the input data E1, E2, E3. The logic circuit 1 is designed to detect whether the relationship is fulfilled, and to provide an error signal V at an output 19 if the relationship is not fulfilled. The test circuit 3 is designed to alter the logic-circuit-internal combinations 2. The test circuit 3 is designed to detect the error signal V, and is furthermore designed to output an alarm signal A if the error signal V is not detected upon alteration of the logic-circuit-internal combinations 2.

The test circuit makes it possible, through targeted alteration of the logic-circuit-internal combinations 2, to simulate an attack by means of which the functionality of the logic circuit 1 is checked.

It should be noted that exemplary embodiments of the logic-circuit-internal combinations 2 comprise circuit elements for digital data processing. One exemplary embodiment comprises circuits for implementing a logic operation, such as an AND combination or an OR combination. One exemplary embodiment comprises a memory element. One exemplary embodiment comprises a multiplexer. One exemplary embodiment comprises a conductive connection that can be interrupted. One exemplary embodiment comprises a conductive connection whose coupling can be changed over from one potential node toward another. One exemplary embodiment comprises a switch. In exemplary embodiments, the change brings about an alteration of the logic state in the circuit element. In other exemplary embodiments, the change brings about an alteration of the couplings within the logic-circuit-internal combinations, for example by the alteration of the switch position.

Figure 2:
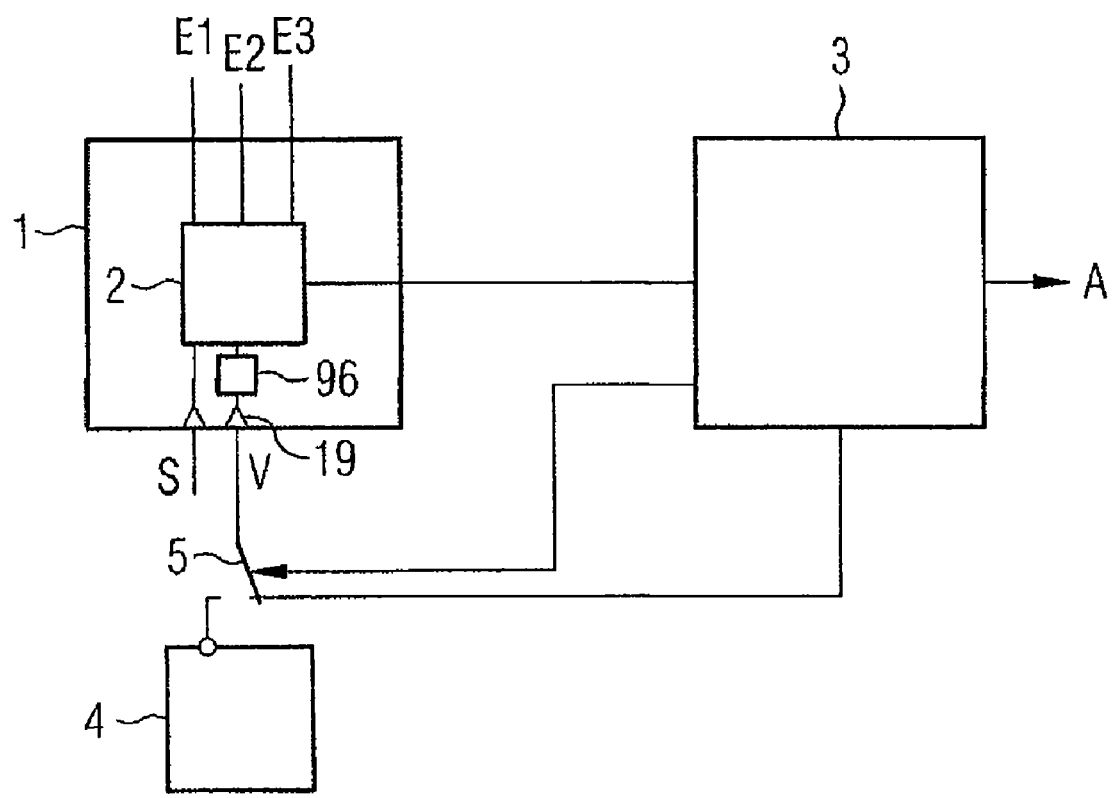
FIG. 2 shows a further exemplary embodiment of a circuit arrangement.

FIG. 2 shows a further exemplary embodiment of a circuit arrangement. It should be noted that identical features are provided with identical reference symbols.

The circuit arrangement comprises a logic circuit 1 and a test circuit 3. The logic circuit generates the output data S from the input data E1, E2, E3 by the input data being processed in logic-circuit-internal combinations 2. The output data S are in a predetermined relationship with the input data E1, E2, E3. Said predetermined relationship is predetermined by the logic-circuit-internal combinations by means of which the output data S are generated from the input data E1, E2, E3.

The test circuit 3 is designed to alter the logic-circuit-internal combinations 2. As a result, an intervention is made on the generation of the output data S, such that the predetermined relationship is generally no longer fulfilled.

An error detection device 96 is furthermore provided, which is coupled to the logic-circuit-internal combinations 2. The error detection device 96 is designed to check whether the predetermined relationship is fulfilled and to provide an error signal V if this is not the case.

The circuit arrangement furthermore comprises an alarm device 4, which is designed to trigger an alarm reaction if the error signal V is detected on the input side.

The alarm reaction serves to combat attacks. It can be of a diverse nature. In one exemplary embodiment, the alarm reaction comprises interrupting the data processing. In one exemplary embodiment, memories and/or registers are erased. As an alternative or in addition, provision can be made for shutting down the circuit operation, which is also referred to as reset.

The output 19 at which the error signal V is provided can be coupled to the alarm device 4 or to the test circuit 3 via a switch 5.

In a normal operation mode, the logic circuit 1 and the alarm device 4 are coupled, such that the alarm reaction is triggered upon detection of the error signal V.

In a test operation mode, in which the functionality of the logic circuit, in particular the error detection function thereof, is checked, the logic circuit 1 is coupled to the test circuit 3, such that the test circuit 3 can detect the error signal V. If the error signal V is detected by the test circuit 4 after state alteration of the logic-circuit-internal combinations 2, this permits a conclusion to be drawn about the correct functioning of the error detection. An attack that has manipulated the error detection is not present.

Figure 3:
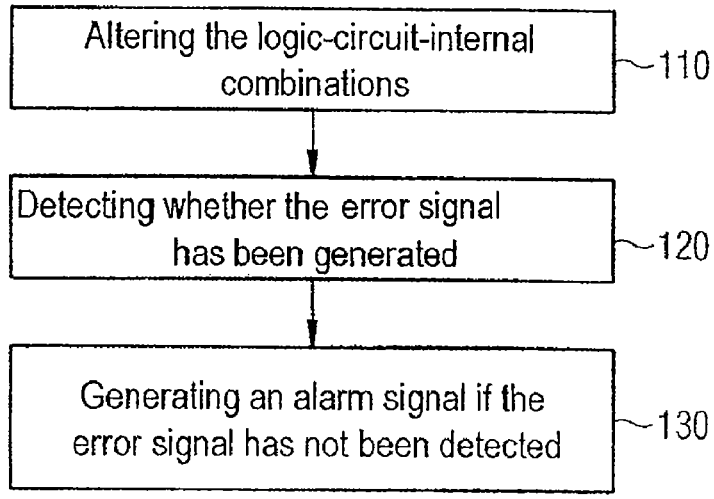
FIG. 3 shows an exemplary embodiment of a method for testing a circuit arrangement on the basis of a flowchart.

FIG. 3 illustrates a method for checking the functionality of a logic circuit 1 that generates output data S from input data E1, E2, E3 by logic-circuit-internal combinations 2, such that the output data S are in a predetermined relationship with the input data E1, E2, E3, wherein the logic circuit 1 detects whether the relationship is fulfilled, and provides an error signal V if the relationship is not fulfilled. The method comprises: altering the logic-circuit-internal combinations 2 by means of a test circuit 3, as illustrated in block 110; detecting whether the error signal V has been generated, as illustrated in block 120, and providing an alarm signal A if the error signal V has not been detected, as illustrated in block 130.

In one exemplary embodiment, in a normal operation mode, an alarm reaction is triggered if the error signal V is detected without the alteration of the logic-circuit-internal combinations 2 having been initiated beforehand. In such a case, the error signal V is an indicator of an attack. The alarm reaction serves to avert the attack, for example by the circuit being shut down.

In a test operation mode in which the alteration of the logic-circuit-internal combinations 2 has been initiated, the alarm reaction is not triggered if the error signal V is detected.

Figure 4:
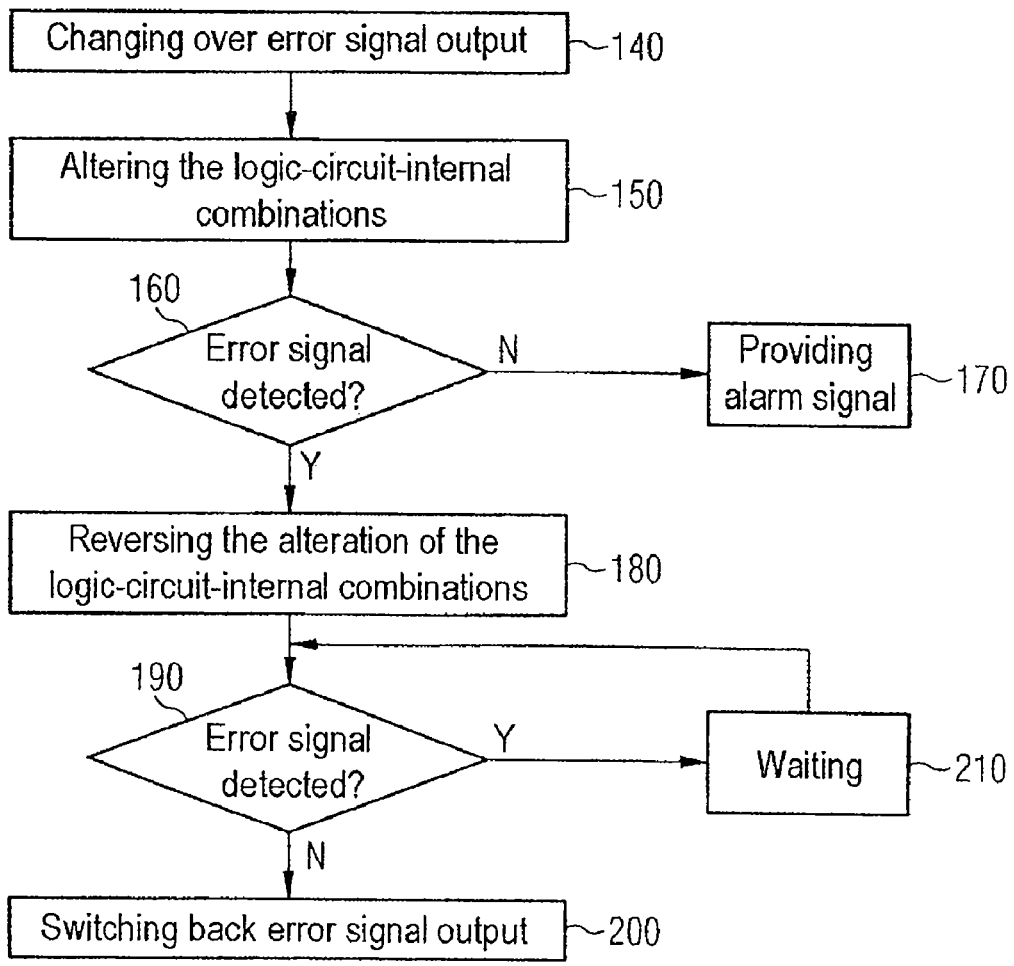
FIG. 4 shows a further exemplary embodiment of a method for testing a circuit arrangement on the basis of a flowchart.

FIG. 4 shows a further exemplary embodiment of a method, illustrating the changeover between the normal operation mode and the test operation mode.

For changing over to the test operation mode, the error signal output 19, at which the error signal V is provided, is changed over in step 140. The changeover is effected in such a way that the error signal V, if it is generated, is provided for the test circuit 3. A subsequent step 150 involves altering the logic-circuit-internal combinations 2. A step 160 involves checking whether the error signal V has been activated. If this is not the case, an attack can be deduced. As an alternative, it is also conceivable that the logic circuit 1, in particular the error detection device 96, is defective. If no error signal V is detected, an alarm signal is provided, as illustrated in block 170.

If the error signal V has been detected in step 160, the alteration of the logic-circuit-internal combination states is reversed in step 180. Step 190 involves checking whether the error signal V is then still activated. If this is the case, step 210 involves waiting until that is no longer so. Afterward, step 200 involves switching back the error signal output 19, such that the circuit is switched back to the normal operation mode.

It should be noted that in the normal operation mode, the detection of the error signal V would lead to the triggering of the alarm reaction.

Figure 5:
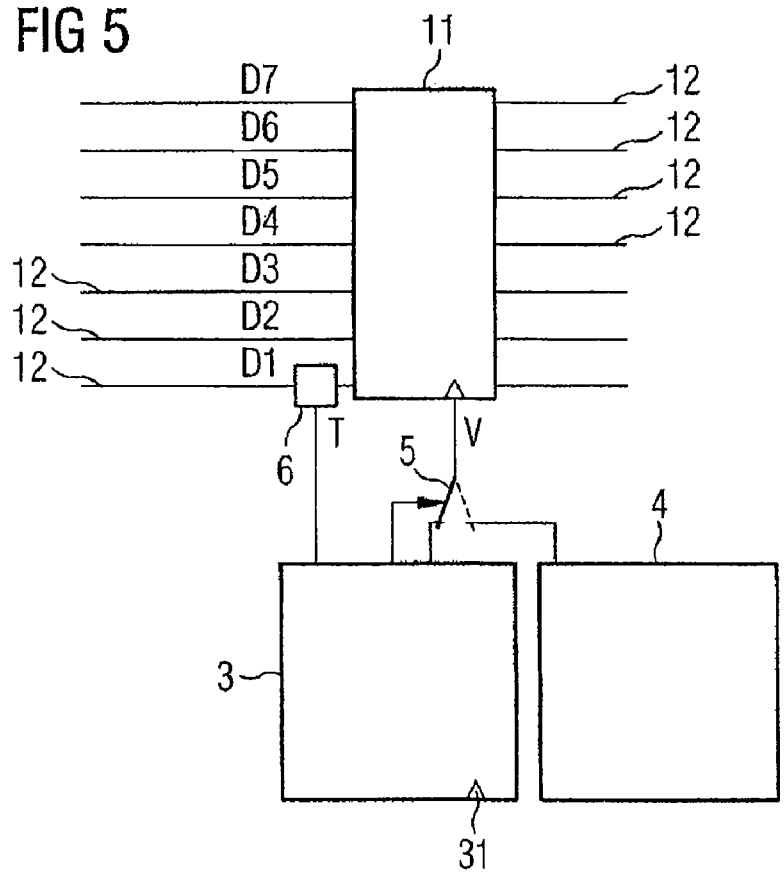
FIG. 5 shows an exemplary embodiment with a bus system.

FIG. 5 shows an exemplary embodiment in which the logic circuit is embodied as a bus system 11, 12. The bus system 11, 12 comprises a multiplicity of bus lines 12 on which data D1, D2, D3, D4, D5, D6, D7 are present.

The bus system 11, 12 furthermore comprises an error detection device, which is embodied as parity error detection 11. A group of bits to be checked is checked to the effect of whether it comprises an odd or even number of a predetermined state. This result is compared with a check bit, which indicates whether an odd or even number of the predetermined state should be present. If the result and the check bit differ, an error is present. The parity error detection 11 is designed to output the error signal V upon detection of an error.

One exemplary embodiment of the error detection device is designed to perform error detection on the basis of error detecting coding (Error Detection Codes, EDC). One or a plurality of errors can thereby be detected.

In one exemplary embodiment, the error detection is provided for bit sequences on a bus line 12. In one exemplary embodiment, the error detection is effected in parallel for the bits of a plurality of bus lines 12. In one exemplary embodiment, these approaches are combined.

Furthermore, provision is made of a test circuit 3 having an output 31 and an alarm device 4. The error signal V can be coupled to the test circuit 3 or to the alarm device 4 via a switch 5.

The test circuit 3 is coupled to the bus system 11, 12 via a coupling element 6. In the exemplary embodiment illustrated, the coupling element 6 is coupled to one of the bus lines 12. In a further exemplary embodiment, the test circuit 3 is coupled to a plurality of bus lines 12. The test circuit generates a test signal T present at the coupling element 6. The test signal T is suitable for initiating the changeover of states.

In one exemplary embodiment, the coupling element 6 is embodied as an Exclusive-OR combination, such that the data of the bus line 12 coupled thereto can be inverted.

In one exemplary embodiment, the coupling element 6 impresses predetermined data on the bus lines 12. Such impressing is also referred to as "stuck-at-1" or "stuck-at-0". The designation depends on the impressed state, logic "1" or logic "0", respectively.

It should be noted that a combination and/or a successive disposition of features of the exemplary embodiments, in particular concerning the coupling elements, are conceivable.

In the normal operation mode, the parity error detection 11 is coupled to the alarm device 4, such that, in the case of a detected error, the outputting of the error signal V results in the alarm reaction.

In the test operation mode, the functionality of the error detection is checked. If this is absent, the conclusion of a possible attack can be drawn.

The changeover to the test operation mode is initiated by the test circuit 3. The switch couples the output of the parity error detection 11 at which the error signal V is provided to the test circuit 3. The error signal V is thereby diverted.

Afterward, an error in the bus system 11, 12 is simulated by the test circuit 3. The test signal T is applied to the coupling element 6, such that the data signal D1 of the bus line 12 is altered. The predetermined relationship of the data on the bus lines 12 is thereby altered. The data no longer correspond to the check bit. This is detected as an error, and the error signal V is output.

The test circuit 3 checks whether the error signal V has been activated after the error simulation that took place. If the error signal V is not detected, the test circuit 3 generates an alarm signal in order to indicate the defective function of the bus system 11, 12. The alarm signal is provided at the output 31.

If the error signal V has been detected after the error simulation that took place, the error simulation is ended and the withdrawal of the error signal V is awaited. The output of the parity error detection 11 at which the error signal V is provided is switched back to the alarm device 4 again.

Figure 6:
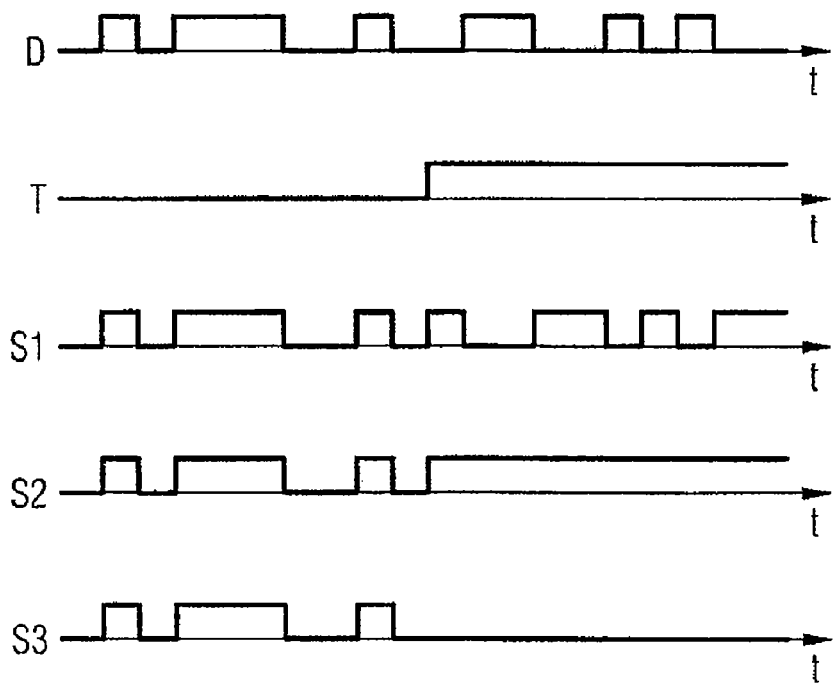
FIG. 6 shows exemplary temporal signal profiles in an exemplary embodiment with a bus system.

FIG. 6 shows temporal signal profiles on a bus line 12 which illustrate by way of example data manipulations by the test circuit 3.

A data signal D is plotted against the time axis T. The data signal D can assume either a first state (logic "0") or a second state (logic "1"). The profile of the test signal T provided by the test circuit 3 is likewise represented against the time axis t.

Signals S1, S2, S3 are output signals of different exemplary embodiments of the coupling element 6.

The first signal S1 results from the Exclusive-OR combination of the data signal D and the test signal T. The Exclusive-OR combination has the effect that the data signal D and the first signal S1 correspond if the test signal T has the first state. After the test signal T has undergone transition to the second state, the first signal S1 and the data signal D are mutually inverse.

The second signal S2 results from a stuck-at-1 combination. The second signal S2 assumes the second state if the test signal T undergoes transition to the second state. In one exemplary embodiment, a stuck-at-1 combination is generated by means of a logic OR combination.

The third signal S3 results from a stuck-at-0 combination. The third signal S3 assumes the first state if the test signal T undergoes transition to the second state. In one exemplary embodiment, a stuck-at-0 combination is generated by means of a logic AND combination with an inverted test signal input.

Figure 7:
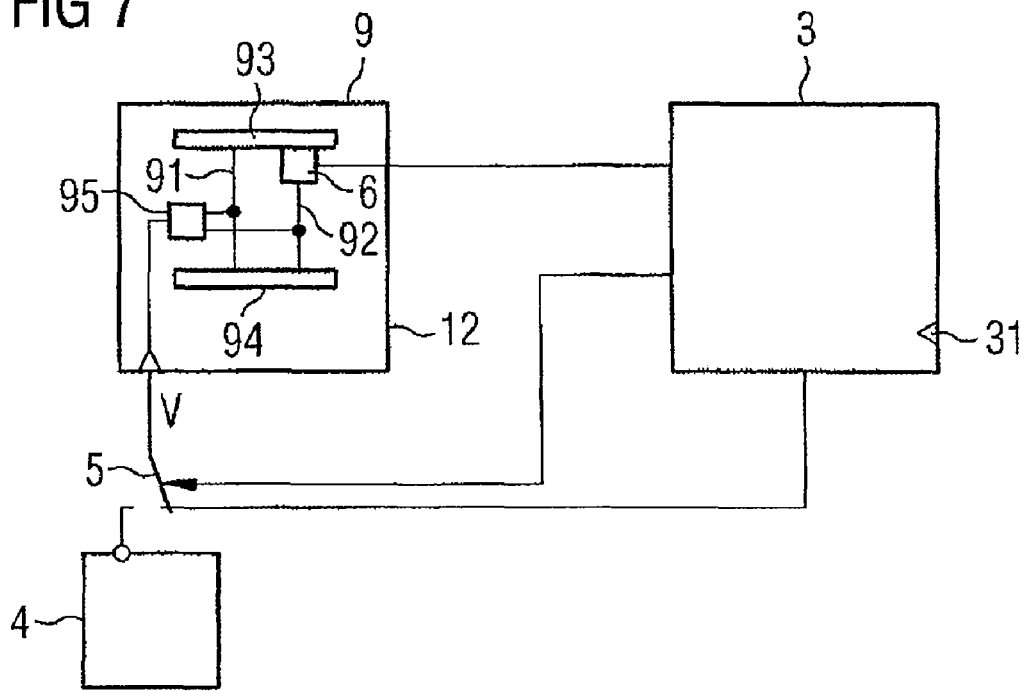
FIG. 7 shows an exemplary embodiment with a cryptographic arithmetic unit.

FIG. 7 shows an exemplary embodiment of a circuit arrangement comprising a cryptographic arithmetic unit 9. A cryptographic arithmetic unit is designed to carry out symmetrical encryptions or asymmetrical encryptions. Exemplary embodiments of a symmetrical encryption are DES and AES. An exemplary embodiment of an asymmetrical encryption is RSA. Exemplary embodiments of cryptographic arithmetic units are designed to provide special functions which make the encryption calculations or decryption calculations fast and effective. In one exemplary embodiment, the encryption operation or the decryption operation or parts thereof is or are provided in hardwired fashion.

In one exemplary embodiment, the cryptographic arithmetic unit 9 is designed to detect errors as a result of algorithmic functions in the drive software. In this case, a corresponding control device of the cryptographic arithmetic unit 9 is designed in this way. In one exemplary embodiment, the cryptographic arithmetic unit 9 is designed to detect errors by means of an error detection device.

Furthermore, provision is made of a test circuit 3 having an output 31 and an alarm device 4. The error signal V can be coupled to the test circuit 3 or to the alarm device 4 via a switch 5.

It should be noted that the illustration of the exemplary embodiment, and also of the subsequent exemplary embodiments, concentrates on those parts of the cryptographic arithmetic unit 9 whose state can be altered by the test circuit 3.

In the exemplary embodiment illustrated, the arithmetic unit 9 comprises a dual rail logic 91, 91, 93, 94, in which a bit is transmitted via a first line 19 and the inverted bit is transmitted via a second line 92 between a first circuit region 93 and a second circuit region 94. If the same state is present on the first and the second line 91, 92, an error is present since this state combination is not provided according to the coding specification. Such error-indicating states can be detected by means of a so-called forbidden state detector 95, which detects the states on the lines 91, 92 of the dual rail logic 91, 92, 93, 94. If an error is present, then the forbidden state detector 95 outputs the error signal V.

The test circuit 3 is coupled to the dual rail logic 91, 92, 93, 94 in such a way that the data on at least one of the lines 91, 92 are altered. In this exemplary embodiment, the coupling element 6 is provided for this purpose. In one exemplary embodiment, the coupling element 6 is embodied as an Exclusive-OR combination.

In one exemplary embodiment, the coupling element 6 is embodied as a stuck-at-0 combination. In one exemplary embodiment, the coupling element 6 is embodied as a stuck-at-1 combination.

In the normal operation mode, the error signal V is coupled to the alarm device 4.

The functional test is effected as in the above-described exemplary embodiment in FIG. 5. The output at which the error signal is provided is coupled to the test circuit 3 during the test operation mode. The test circuit 3 detects whether the forbidden state detector 95 outputs the error signal V after simulation of an error. If this is not the case, the alarm signal is generated, indicating that the error detection is not functioning.

It should be noted that dual rail logic systems are used not only in cryptographic arithmetic units, but also in memories, for example.

Figure 8:
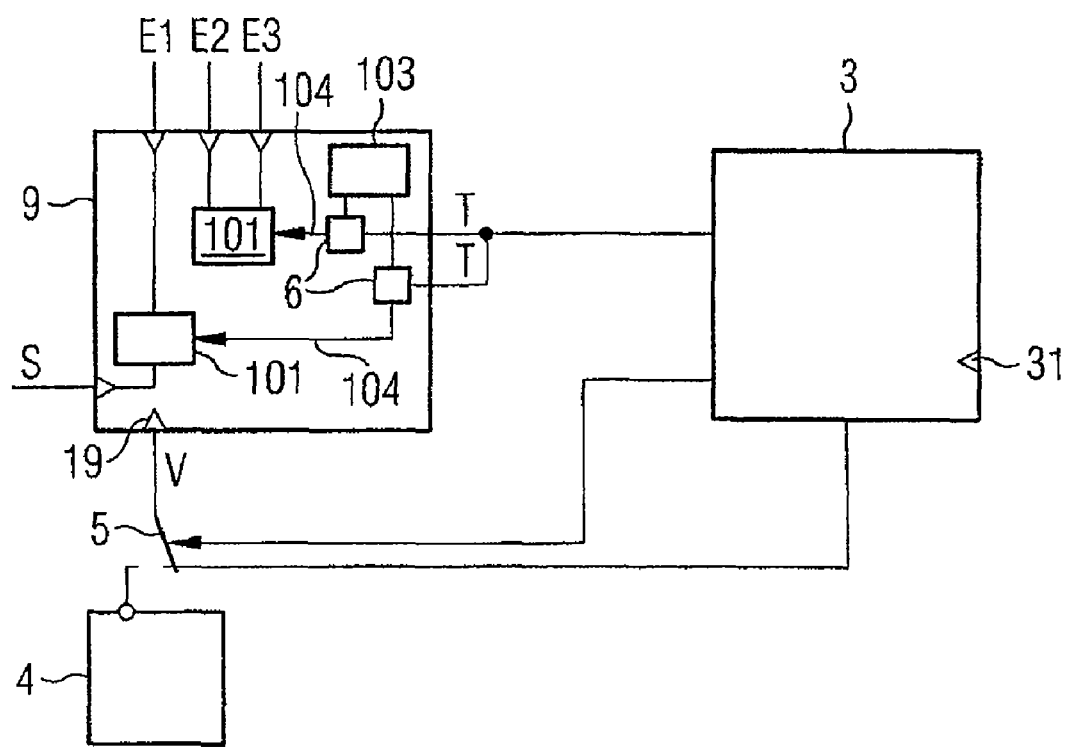
FIG. 8 shows a further exemplary embodiment with a cryptographic arithmetic unit.

FIG. 8 shows a further exemplary embodiment of a circuit arrangement comprising a test circuit 3 and a logic circuit, which is embodied as a cryptographic arithmetic unit 9.

The cryptographic arithmetic unit 9 combines input signals E1, E2, E3 to form an output signal S. The error signal V is provided at an error signal output.

The error signal output 19 can be coupled to the test circuit 3 or to the alarm device 4 via a switch 5. The changeover of the switch 5 is initiated by the test circuit 3.

The cryptographic arithmetic unit 9 comprises circuit parts 101 that are designed to logically combine, process or store data signals. One exemplary embodiment of such a circuit part 101 is an adder. One exemplary embodiment of such a circuit part 101 is a shifter, or shift register. Furthermore, a control device 103 is provided, which drives the circuit parts 101 via drive lines 104.

The drive lines 104 are coupled to the test circuit 3 via coupling elements 6. Exemplary embodiments of the coupling elements comprise, for example, Exclusive-OR combinations, stuck-at-1 combinations or stuck-at-0 combinations.

In the normal operation mode, the error signal V is coupled to the alarm device 4. The test operation mode proceeds as in the above-described exemplary embodiment in FIG. 5.

During the test operation mode, said drive lines 104 are switched according to a different specification or mapping. The coupling with the test signal T leads to different functions of the circuit parts 101, stemming from the switching in accordance with the different specification or mapping. Said different functions are detected by the cryptographic arithmetic unit. In one exemplary embodiment, this is effected by an algorithm which checks the computation results in terms of software and outputs an error signal V upon detection of an error. In one exemplary embodiment, for test purposes, a test computation is carried out and a check is made to determine whether the algorithm detects the error impressing and the error signal V is consequently generated.

Figure 9:
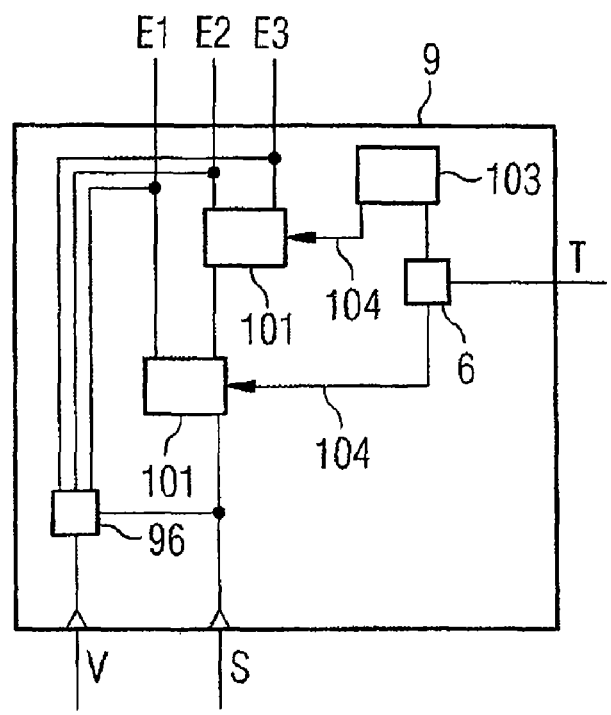
FIG. 9 shows an exemplary embodiment of a cryptographic arithmetic unit.

FIG. 9 shows a further exemplary embodiment of a cryptographic arithmetic unit 9 comprising circuit parts 101 that are driven by a control device 103 via drive lines 104. In this exemplary embodiment, one of the drive lines 104 is coupled to the test signal T via a coupling element 6.

In this exemplary embodiment, an error detection device 96 is furthermore provided, which is coupled to the input signals E1, E2, E3 and the output signal S. The error detection device 96 checks whether the signals E1, E2, E3, S are in a predetermined relationship. If this is not the case, the error signal V is output. In one exemplary embodiment, the error detection device 96 is coupled to lines and/or potential nodes within the cryptographic arithmetic unit 9, for example to the inputs and outputs of a circuit part 101. It is thereby possible also to check intermediate results.

Figure 10:
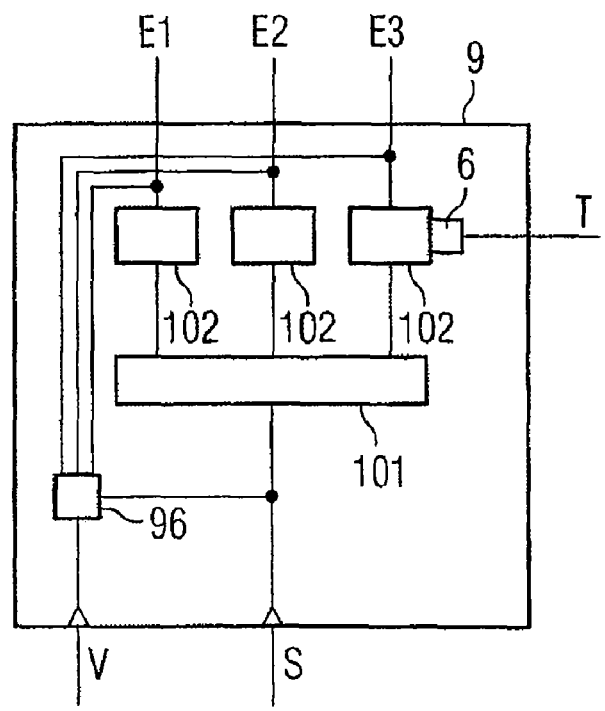
FIG. 10 shows an exemplary embodiment of a cryptographic arithmetic unit.

FIG. 10 shows a further cryptographic arithmetic unit 9, in which the input signals E1, E2, E3 are coupled to memory units 102. One exemplary embodiment of such a memory unit 102 is a register. The memory units 102 are combined to form an output signal by means of a circuit part 101. An error detection device 96 is furthermore provided, which taps off the input signals E1, E2, E3 and the output signal S and provides the error signal V if the input signals E1, E2, E3 and the output signal S are not in the predetermined relationship.

It should be noted that for checking the predetermined relationship, the input signals E1, E2, E3 themselves need not be tapped off, rather the tapping can also be effected at data nodes within the cryptographic arithmetic unit 9. In this way, the correctness of the input and output data E1, E2, E3, S is deduced indirectly from the comparison of intermediate results within the logic circuit. However, only a part of the circuit which lies between the tapping points of the intermediate results is checked during the checking on the basis of the intermediate results.

In the exemplary embodiment illustrated, the test signal T is coupled to one of the memory units 102 via a coupling element 6. In one exemplary embodiment, the coupling is effected in such a way that data in the memory unit 102 are set to a fixed value. A stuck-at-1 combination or a stuck-at-0 combination can be used for this purpose. In one exemplary embodiment, the coupling has the effect that the data in the memory unit 102 are inverted. Exclusive-OR combination can be used for this purpose.

A different calculation during the test operation mode is detected by the error detection device 96 and indicated by the provision of the error signal V.

In a further exemplary embodiment, an error detection device is not provided, rather the correctness of the calculation is detected algorithmically.

Figure 11:
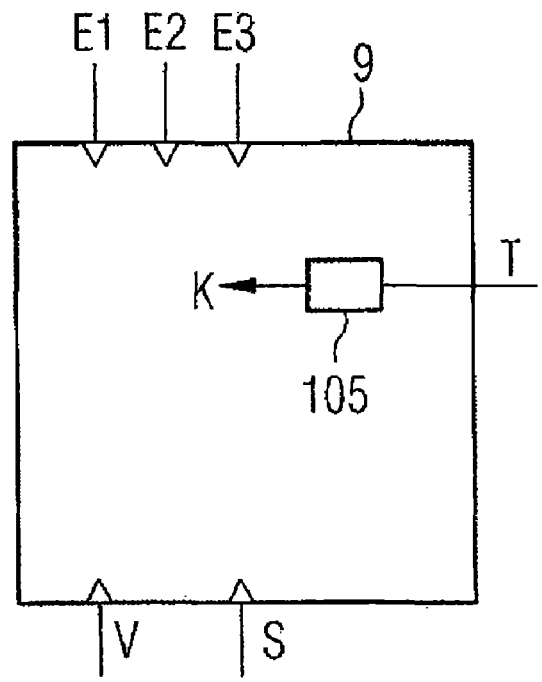
FIG. 11 shows an exemplary embodiment of a cryptographic arithmetic unit.

FIG. 11 shows a further exemplary embodiment of a cryptographic arithmetic unit 9, designed to combine the input signals E1, E2, E3 to form the output signal S. The cryptographic arithmetic unit 9 is furthermore designed to provide an error signal V if the combination is not in a predetermined relationship.

The cryptographic arithmetic unit 9 comprises a key arithmetic unit 105. In one exemplary embodiment, the key arithmetic unit 105 is embodied as a so-called key scheduling arithmetic unit in a DES or AES arithmetic unit. The key arithmetic unit 105 generates a partial key K or the entire key K for calculating a cryptographic function.

The test circuit 3 is coupled to the key arithmetic unit 105 in such a way that the generation of the key K is altered. In one exemplary embodiment, the test signal T has the effect that shift operations are omitted or that shifting too far or excessively short shifting is effected.

The computation errors that occur in the case of an altered key K are detected, and the error signal V is output. In one exemplary embodiment, the detection is effected by an error detection device 96. In a further exemplary embodiment, the detection is effected algorithmically.

Figure 12:
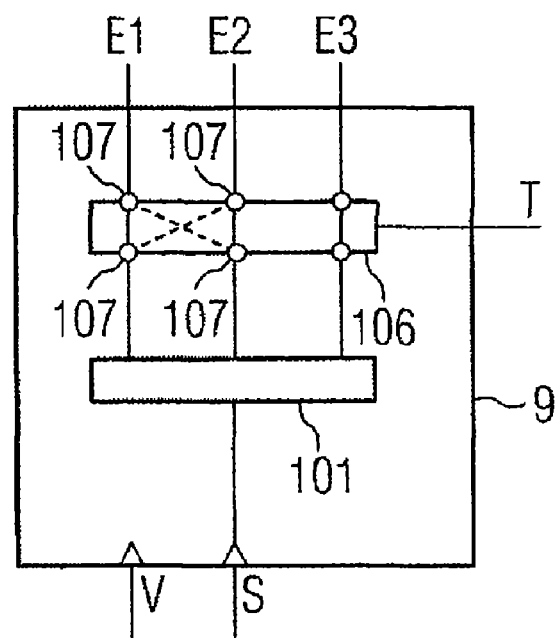
FIG. 12 shows an exemplary embodiment of a cryptographic arithmetic unit.

FIG. 12 shows a further exemplary embodiment of the cryptographic arithmetic unit 9. The cryptographic arithmetic unit 9 comprises a multiplexer 106 and a circuit part 101 connected downstream. The input signals E1, E2, E3 are present at input-side data nodes 107 of the multiplexer 106. The input signals E1, E2, E3 are provided at output-side data nodes 107 of the multiplexer 106 and fed to inputs of the circuit part 101 in order to generate the output signal S.

Through the coupling of the test circuit 3 to the multiplexer 106, it is possible to alter the couplings between the output-side data nodes 107 and the input-side data nodes 107, such that different data are provided at output nodes 107 of the multiplexer 106. The output signal S is altered by the interchanges. These deviations can be detected by an algorithm.

In a further exemplary embodiment, an error detection device is provided which generates the error signal.

In one exemplary embodiment, a circuit part is provided which carries out permutations, that is to say predetermined interchanges. The permutations are altered by means of a coupling of the test circuit to such a circuit part.

Figure 13:
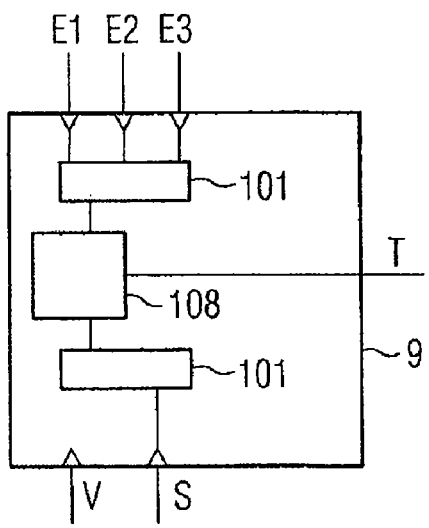
FIG. 13 shows an exemplary embodiment of a cryptographic arithmetic unit.

FIG. 13 shows a further exemplary embodiment of a cryptographic arithmetic unit. The cryptographic arithmetic unit for calculating encryptions in accordance with DES or AES comprises a so-called S-box 108 for nonlinear transformation. An S-box is a table memory device in which nonlinear transformation results are stored. It should be noted that table memory devices of this type are also used in memories, for example. In one exemplary embodiment, the test circuit is coupled to the S-box 108 in such a way that it is altered with regard to its addressing. In a further exemplary embodiment, the test circuit is coupled in such a way that the read-out of the S-box 108 is altered. In one exemplary embodiment, the test circuit is coupled to the S-box 108 in such a way that its content can be altered. The content can be altered for example as a result of an inversion by means of an Exclusive-OR combination. These alterations have the effect that incorrect values are provided by the S-box. These corruptions are detected by algorithmic monitoring. In one exemplary embodiment, the detection is effected by means of an error detection device 96.

It should be noted that the features for error simulation in the exemplary embodiments of the cryptographic arithmetic units can be combined. The error detection can be effected algorithmically and/or by means of an error detection device.

Figure 14:
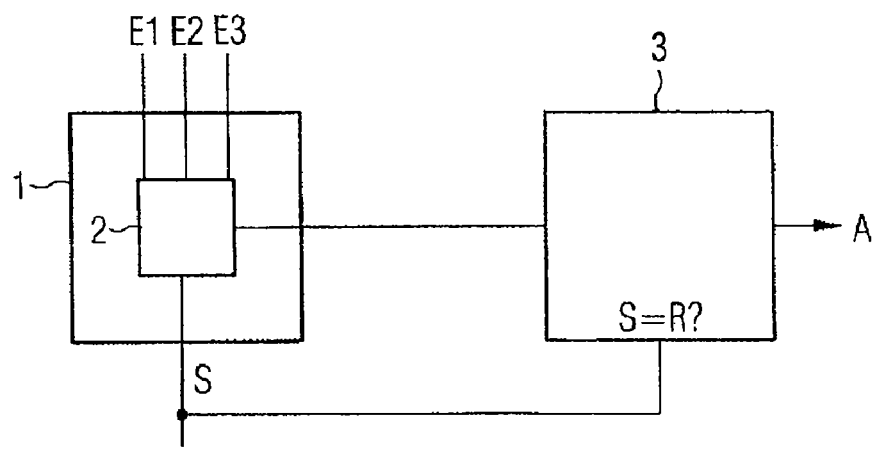
FIG. 14 shows an exemplary embodiment with a circuit arrangement.

FIG. 14 shows the block diagram of an exemplary embodiment of a circuit arrangement comprising a logic circuit 1, designed to provide output data S from input data E1, E2, E3, said output data being generated from the input data E1, E2, E3 by logic-circuit-internal combinations 2, such that the output data S are in a predetermined relationship with the input data E1, E2, E3. The circuit arrangement furthermore comprises a test circuit 3, coupled to the logic circuit in such a way that the logic-circuit-internal combinations 2 can be altered, wherein the test circuit 3 is designed to output an alarm signal A if the output data S are in the predetermined relationship with the input data E1, E2, E3 upon alteration of the logic-circuit-internal combinations 2. In one exemplary embodiment, checking the predetermined relationship comprises comparing the output signal S with a predetermined value R.

Through targeted alteration of the logic-circuit-internal combinations 2, the test circuit 3 makes it possible to simulate an attack by means of which the functionality of the logic circuit 1 is checked.

Figure 15:
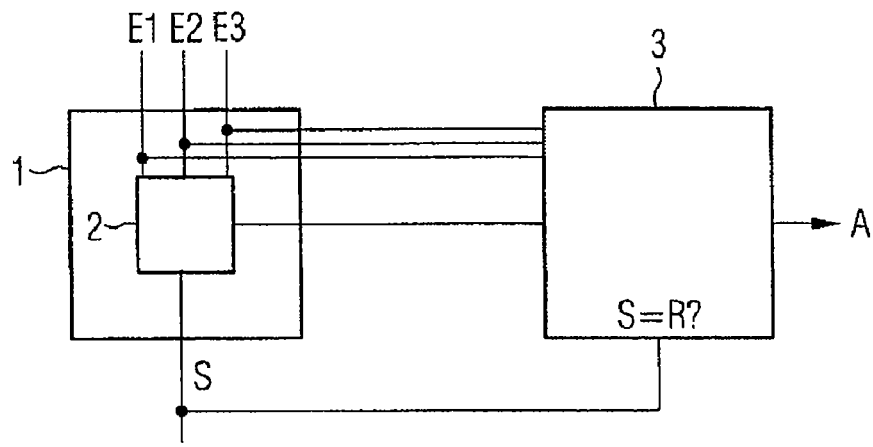
FIG. 15 shows a further exemplary embodiment with a circuit arrangement.

FIG. 15 shows a further exemplary embodiment, which differs from the preceding exemplary embodiment in that the test circuit 3 is designed to apply predetermined input signals E1, E2, E3 to the logic circuit 1.

An exemplary embodiment of a method for checking the function of such a logic circuit 1 comprises: altering the logic-circuit-internal combinations 2; applying input data E1, E2, E3; generating the output data S; detecting the output data S and outputting an alarm signal A if the output data S are in the predetermined relationship with the input data E1, E2, E3.

In one exemplary embodiment, the method provides for altering the logic-circuit-internal combinations in terms of software. Such an alteration in terms of software can be provided in memory encryptions, for example, in order to perform a key change. In one exemplary embodiment, a key alteration in this way is performed in a cryptographic arithmetic unit. In another exemplary embodiment, a key alteration in this way is performed in a decoder.

An alarm signal is output if the output data do not correspond to predetermined data. For this purpose, it is possible to use the tables provided in cryptographic arithmetic units for the functional test after manufacture with expected values in the case of different keys.

Figure 16:
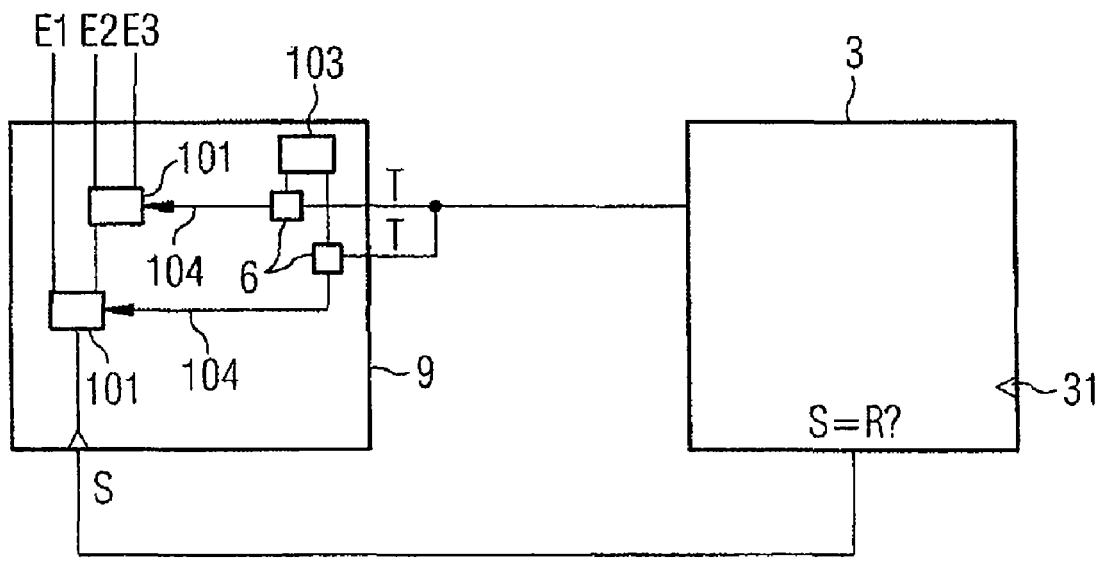
FIG. 16 shows an exemplary embodiment with a cryptographic arithmetic unit.

FIG. 16 shows an exemplary embodiment in which the logic circuit is embodied as a cryptographic arithmetic unit 9. This exemplary embodiment is based on the exemplary embodiment shown in FIG. 8. It differs from the latter, however, in that the functioning of the cryptographic arithmetic unit 9 is checked by the output signal S being generated from the input signals E1, E2, E3 and a check being made to determine whether said output signal deviates from a predetermined value R. In one exemplary embodiment, the predetermined value R is stored in the test circuit 3. In one exemplary embodiment, said value has been generated by a preceding calculation. In this case, a first output signal is generated without the test circuit 3 changing states in the cryptographic arithmetic unit. A second output signal is generated after the test circuit 3 has changed states in the cryptographic arithmetic unit. If the output signals generated do not differ, this indicates an attack.

It should be noted that the other exemplary embodiments of a cryptographic arithmetic unit whose states can be altered by the test circuit 3 in different ways can be tested with regard to a possible manipulation in a corresponding manner by a comparison of calculated output data S—in one instance without error simulation by the test circuit and in one instance with error simulation by the test circuit.

Figure 17:
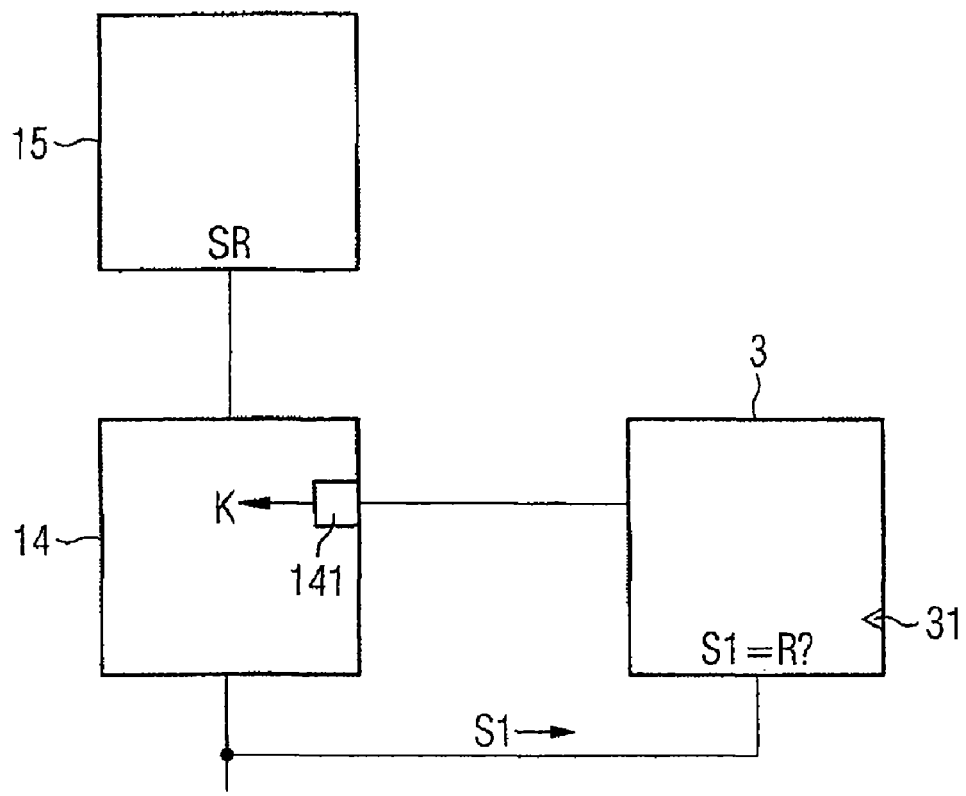
FIG. 17 shows an exemplary embodiment with a memory encryption device.

FIG. 17 shows an exemplary embodiment in which the logic circuit is embodied as a memory encryption device 14. Such a memory encryption device 14 is also referred to as MED (Memory Encryption Decryption Unit).

The memory encryption device 14 is connected ahead of a memory 15. The memory 15 is embodied for example as a RAM or NVM. Data to be stored in the memory 15 are encrypted by the memory encryption device 14 prior to storage. During read-out, the data stored in encrypted fashion are decrypted by the memory encryption device 14. The memory encryption device 14 comprises a means 141 for providing a key K. The test circuit 3 having an output 31 for providing the alarm signal A is designed to alter the key K.

In a further exemplary embodiment, the memory encryption is used for a ROM. Only decryption is effected in this case.

In order to check the functionality of the memory encryption device 14, the key K is altered or set. A reference value SR is read out from the memory 15 and decrypted. A check is made to determine whether the read-out and decrypted value S1 corresponds to a predetermined value R. If this is not the case, the alarm signal is output at the output 31 of the test circuit 3. In one exemplary embodiment, both the reference value SR and the predetermined value R are a bit sequence.

In one exemplary embodiment, the predetermined value R is stored in the test circuit 3. In one exemplary embodiment, the predetermined value is read from the memory 15.

Figure 18:
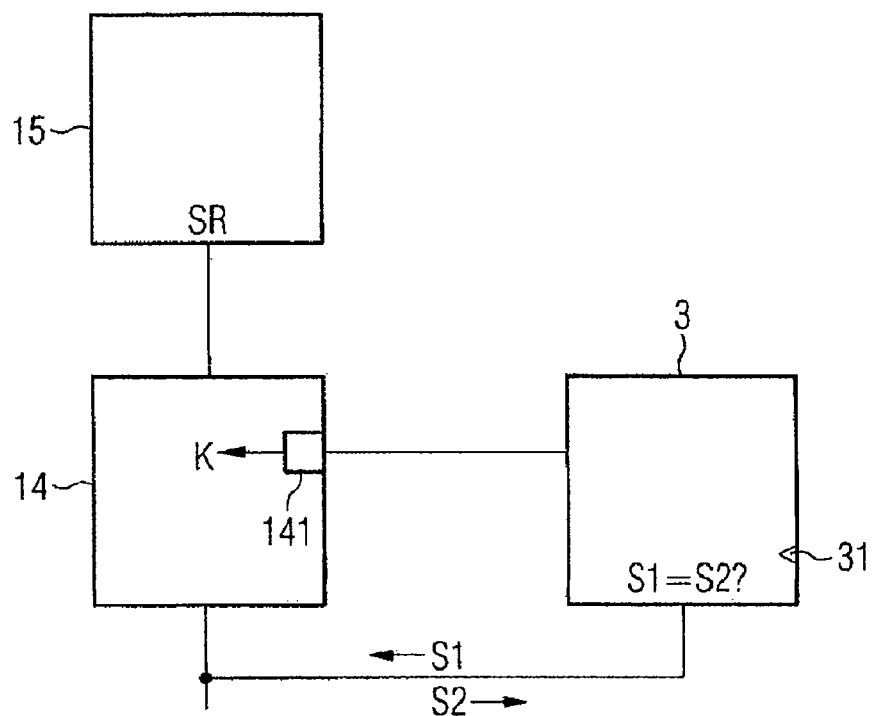
FIG. 18 shows an exemplary embodiment with a memory encryption device.

FIG. 18 shows a further exemplary embodiment comprising a memory 15 and the memory encryption device 14 having the means 141 for providing the key K. The test circuit 3 is coupled to the means 141 in such a way that the key K can be altered.

In order to check the functionality of the memory encryption device 14, a first key K is provided. A value S1 predetermined by the test circuit 3 is encrypted by the memory encryption device 14 and the encrypted value SR is stored in the memory 15. The first key K is then altered by the test circuit 3, such that it corresponds to a second key. The stored value SR is read out from the memory 15. If the value S to be stored and the read-out value S2 differ, the memory encryption device 14 is functioning.

In one exemplary embodiment, a predetermined value for the read-out value S2 is stored in the test circuit and it is possible to check not only whether the value S1 to be stored and the read-out value S2 differ, but also whether the read-out value S2 corresponds to the predetermined value.

Figure 19:
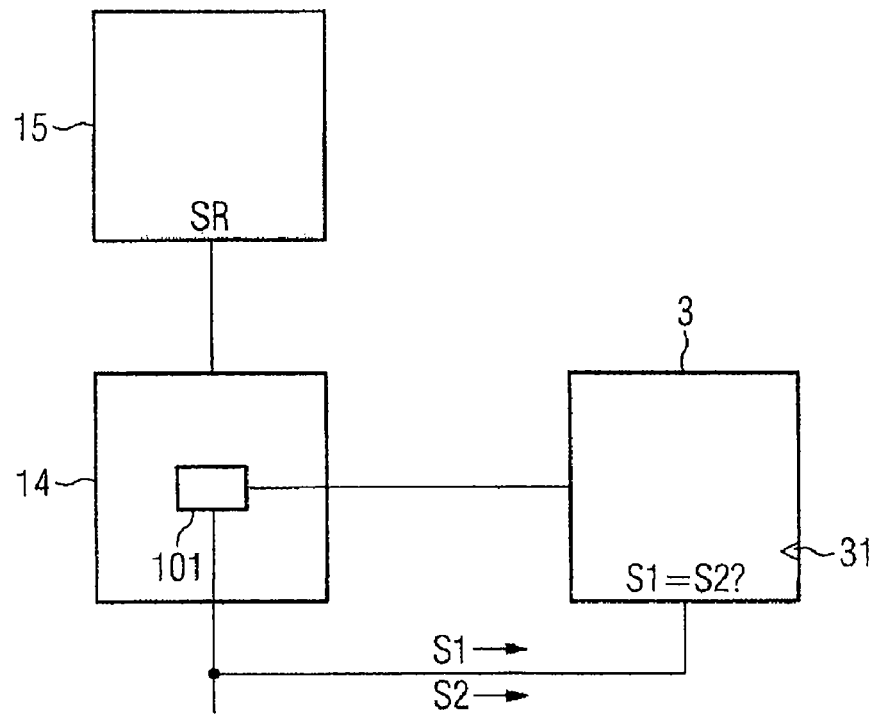
FIG. 19 shows an exemplary embodiment with a memory encryption device.

FIG. 19 shows a further exemplary embodiment of a memory encryption device 14 coupled to a memory 15. The test circuit 3 is coupled to circuit parts 101 of the memory encryption device 14. In one exemplary embodiment, the coupling is effected via an Exclusive-OR combination. In one exemplary embodiment, the coupling is effected via a stuck-at-1 combination and/or via a stuck-at-0 combination.

In order to check the functionality of the memory encryption device 14, firstly a reference value SR is read out from the memory 15 and decrypted. The first read-out value S1 is communicated to the test circuit 3. The circuit parts 101 in the memory encryption device 14 are then altered by the test circuit 3. In one exemplary embodiment, lines and/or potential nodes in the circuit part 101 are set to a different state value.

The stored reference value SR is again read out and decrypted. The second read-out value S2 is communicated to the test circuit 3. A check is then made to determine whether the second read-out value S2 differs from the first read-out value S1. If this is the case, the memory encryption device 14 is functioning.

In a further exemplary embodiment, a value is written to the memory 15 and the same value is written for altered states. The two values are read out and compared. It should be noted that during the read-out operation, either the test circuit is not permitted to intervene in the logic-circuit-internal combinations or the logic-circuit-internal combinations are altered in the same way during both read-out operations. If the two read-out values differ, the memory encryption device 14 is functioning.

FIG. 20 shows a further exemplary embodiment, which differs from the previous exemplary embodiment in that the circuit parts 101 can be bridged, which is also referred to as a bypass of the memory encryption device 14. One exemplary embodiment comprises a switch, for example, which can be used to bypass data processing in circuit parts 101. No encryption or decryption is effected during such bridging. In one exemplary embodiment, only part of the encryption or decryption is bridged, such that only partial encryption or decryption is effected. The bridging is initiated by the test circuit 3.

Checking the function of the circuit arrangement comprises the fact that a reference value SR stored in the memory 15 is read out in encrypted fashion and is read out in unencrypted fashion. If the two read-out values S1 and S2 differ, the memory encryption device is functioning.

Further exemplary embodiments of the functional checking take place in a manner corresponding to that in the exemplary embodiments outlined above. One exemplary embodiment comprises double read-out—once with and once without encryption—and comparison of a previously known memory content. One exemplary embodiment comprises double writing—once with and once without encryption—of a value and comparison after the read-out thereof.

It should be noted that combination of the features in the exemplary embodiments and/or the sequential use thereof is possible.

FIG. 21 shows a further exemplary embodiment, in which the logic circuit is embodied as a decoder 16 of a CPU. The decoder 16 is coupled between a memory 14 and an arithmetic unit 17. The decoder 16 is designed to convert command data BD provided in the memory 14 into control data SD. The control data SD enable the processing of a command BD in the arithmetic unit 17. The test circuit 3 is coupled to circuit parts 101 of the decoder 16 in such a way that said circuit parts can be altered.

For test purposes provision is made for forcing one or more errors in order to check the decoder function. In one exemplary embodiment, the error is forced by the test circuit altering the circuit part 101 via a coupling element. In one exemplary embodiment, the alteration is effected via an Exclusive-OR combination. In one exemplary embodiment, the alteration is effected via a stuck-at-0 combination or a stuck-at-1 combination. In one exemplary embodiment, the alteration is effected via a multiplexer.

Firstly, a command BD corresponding to a function of the arithmetic unit is read from the memory 14. This function is executed and supervised by a program. By way of example, provision can be made for adding two values and for comparing this with a reference value. The test circuit then alters the states of the circuit parts 101 of the decoder 16, such that an intervention is made in the conversion of the command data BD into the control data SD. In the exemplary embodiment, the previous command, which comprised an addition, is now translated as subtraction. After the subtraction of the two values, the result is compared with the reference value.

In one exemplary embodiment, the result of the addition S1 is compared with the result of the subtraction S2. If the values S1 and S2 correspond, this permits a conclusion to be drawn about an attack. In one exemplary embodiment, the results are compared relative to one another or relative to a predetermined value by the test circuit 3.

The circuit arrangement makes it possible to test the functionality of the logic circuit in order to deduce an attack therefrom. Furthermore, testing is performed to determine whether the logic circuit is functionally able to output an alarm signal in the case of an attack.

A method for checking the functionality of such a logic circuit that provides output data from input data, said output data being generated from the input data by logic-circuit-internal combinations, such that the output data are in a predetermined relationship with the input data, wherein the logic circuit is designed to detect whether the relationship is fulfilled and to provide an error signal if the relationship is not fulfilled, provides the following: the logic-circuit-internal combinations are altered by a test circuit. The method will detect whether the error signal has been generated, and an alarm signal is generated if the error signal has not been detected.

Furthermore, a circuit arrangement comprising a logic circuit to be tested and a test circuit is provided. The logic circuit provides output data from input data, said output data being generated from the input data by logic-circuit-internal combinations, such that the output data are in a predetermined relationship with the input data. The test circuit is coupled to the logic circuit in such a way that the logic-circuit-internal combinations can be altered, wherein the test circuit is designed to output an alarm signal if the output data are in the predetermined relationship with the input data upon alteration of the logic-circuit-internal combinations.

The circuit arrangements make it possible to test the functionality of the logic circuit in order to deduce an attack therefrom.

A method for checking the functionality of a logic circuit, designed to provide output data from input data, said output data being generated from the input data by logic-circuit-internal combinations, such that the output data are in a predetermined relationship with the input data, comprises the following: the logic-circuit-internal combinations are altered. Input data are applied. Output data are generated and detected. An alarm signal is output if the output data are in the predetermined relationship with the input data.

It should be noted that the features of the exemplary embodiments of the circuit arrangement can be combined.

The invention claimed is:

1. A circuit arrangement comprising:
   a logic circuit, designed to provide output data from input data, said output data being generated from the input data by logic-circuit-internal combinations, such that the output data are in a predetermined relationship with the input data wherein the logic circuit is designed to detect whether the relationship is fulfilled, and to provide an error signal if the relationship is not fulfilled, and a test circuit, designed to alter the logic-circuit-internal combinations, wherein the test circuit is furthermore designed to detect the error signal, and is designed to output an alarm signal if the error signal is not detected upon alteration of the logic-circuit-internal combinations.

2. The circuit arrangement as claimed in claim 1, wherein an error detection device is provided, designed to generate the error signal, wherein the error detection device is coupled to the logic-circuit-internal combinations, the circuit arrangement is designed to detect algorithmically whether the relationship is fulfilled, an alarm device is provided, coupled to the logic circuit, such that an alarm reaction is triggered if the error signal is detected and the logic-circuit-internal combinations are not altered by the test circuit, and the circuit arrangement is designed not to trigger the alarm reaction if the logic-circuit-internal combinations are altered by the test circuit.

3. The circuit arrangement as claimed in claim 2, wherein the logic-circuit-internal combinations are coupled to the test circuit via an Exclusive-OR combination, the logic-circuit-internal combinations comprise a data node on which a predetermined logic state can be impressed by the test circuit, a memory unit is provided, the stored information of which can be altered by the test circuit and the test circuit is coupled to a plurality of in each case two data nodes coupled to one another, such that the couplings of the data nodes are interchangeable.

4. The circuit arrangement as claimed in claim 3, wherein a dual rail logic circuit is provided, the states of which can be tapped off by the error detection device, a table memory device is provided, the entries and/or addressing of which can be altered by the test circuit, the logic circuit comprises a bus system, and the error detection device comprises a parity bit error detection device.

5. The circuit arrangement as claimed in claim 4, wherein the test circuit is coupled to the bus system in such a way that data present on one bus line or on a plurality of bus lines of the bus system can be altered, the logic circuit comprises a cryptographic arithmetic unit, the test circuit can impress a predetermined state on a line of the dual rail logic circuit or can alter a state on a line of the dual rail logic circuit, drive lines are provided, the states of which can be altered by the test circuit and a key arithmetic unit is provided for generating a key, which is coupled to the test circuit in such a way that the generated key can be altered.

6. A circuit arrangement comprising:

a logic circuit, designed to provide output data from input data, said output data being generated from the input data by logic-circuit-internal combinations, such that the output data are in a predetermined relationship with the input data, and a test circuit, coupled to the logic circuit in such a way that the logic-circuit-internal combinations can be altered, wherein the test circuit is designed to output an alarm signal if the output data are in the predetermined relationship with the input data upon alteration of the logic-circuit-internal combinations.

7. The circuit arrangement as claimed in claim 6, wherein the test circuit is designed to apply predetermined input signals to the logic circuit, the logic-circuit-internal combinations are coupled to the test circuit via an EXCLUSIVE-OR combination, the logic-circuit-internal combinations comprise a data node on which a predetermined logic state can be impressed by the test circuit, and a memory unit is provided, the stored information of which can be altered by the test circuit.

8. The circuit arrangement as claimed in claim 7, wherein the test circuit is coupled to a plurality of in each case two data nodes coupled to one another, such that the couplings of the data nodes are interchangeable, the test circuit is designed to compare the output data with predetermined data, the test circuit is designed to store, as predetermined data, output data which have been provided in the case of non-altered logic-circuit-internal combinations, and a dual rail logic circuit is provided, the states of which can be tapped off by the error detection device.

9. The circuit arrangement as claimed claim 8, wherein a table memory device is provided, the entries and/or addressing of which can be altered by the test circuit, the logic circuit comprises a decoder, which assigns a control datum or control data to a command datum, upon alteration of the logic-circuit-internal combinations, the decoder assigns a different control datum or different control data to the command datum, and the logic circuit comprises a memory encryption device, wherein the memory encryption device is designed to encrypt data and to decrypt encrypted data.

10. The circuit arrangement as claimed in claim 9, wherein the logic-circuit-internal combinations can be altered in such a way that data are output in non-encrypted fashion or in only partly encrypted fashion, or that encrypted data are output in unencrypted fashion or in only partly unencrypted fashion, a means for providing a key, which is coupled to the test circuit in such a way that the key can be altered, the logic circuit comprises a cryptographic arithmetic unit, drive lines are provided, the states of which can be altered by the test circuit, and a key arithmetic unit is provided for generating a key, which is coupled to the test circuit in such a way that the generated key can be altered.

11. A method for checking the function of a logic circuit that provides output data from input data, said output data being generated from the input data by logic-circuit-internal combinations, such that the output data are in a predetermined relationship with the input data, wherein the logic circuit is designed to detect whether the relationship is fulfilled, and to provide an error signal if the relationship is not fulfilled, wherein the method comprises:

altering logic-circuit-internal combinations by means of a test circuit, detecting whether the error signal has been generated, and providing an alarm signal if the error signal has not been detected.

12. The method as claimed in claim 11, wherein triggering an alarm reaction if the error signal is detected without the alteration of the logic-circuit-internal combinations having been initiated beforehand.

13. The method as claimed in claim 12, wherein the alarm reaction is not triggered if the error signal is detected and the alteration of the logic-circuit-internal combinations has been initiated beforehand.

14. The method as claimed 13, wherein
the logic-circuit-internal combinations are altered by inversion and/or are altered by impressing a predetermined state.

15. The method as claimed in claim 14, wherein
altering stored information in the logic-circuit-internal combinations.

16. A method for checking the function of a logic circuit, designed to provide output data from input data, said output data being generated from the input data by logic-circuit-internal combinations, such that the output data are in a predetermined relationship with the input data, wherein the method comprises:
altering logic-circuit-internal combinations,
applying input data,
generating the output data,
detecting the output data, and
outputting an alarm signal if the output data are in the predetermined relationship with the input data.

17. The method as claimed in claim 16, wherein
the logic-circuit-internal combinations are altered in terms of software,
the logic-circuit-internal combinations are altered by inversion and/or are altered by impressing a predetermined state,
altering stored information in the logic-circuit-internal combinations,
the logic-circuit-internal combinations provide a key for memory encryption and/or decryption, and
the logic-circuit-internal combinations provide a key in a cryptographic module.

18. The method as claimed in claim 17, wherein
the logic-circuit-internal combinations provide a key in a decoder,
the output data are compared with predetermined data,
the alarm signal is output if the output data do not correspond to the predetermined data, and
the predetermined data are output data which have been generated in the case of non-altered logic-circuit-internal combinations.

19. The method as claimed in claim 18, wherein
first output data are stored after the alteration of the logic-circuit-internal combinations and second output are stored in the case of non-altered logic-circuit-internal combinations and are compared with one another,
the comparison is effected after the first and the second output data have been read out, and
data are read out from a memory after the alteration of the logic-circuit-internal combinations and the data are read out from the memory in the case of non-altered logic-circuit-internal combinations and are compared with one another after the read-out.

* * * * *